United States Patent
Gärtner et al.

(10) Patent No.: US 9,312,435 B2
(45) Date of Patent: Apr. 12, 2016

(54) OPTOELECTRONIC SEMICONDUCTOR DEVICE

(75) Inventors: Christian Gärtner, Regensburg (DE); Ales Markytan, Regensburg (DE); Albert Schneider, Thalmassing (DE); Stephan Kaiser, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/995,801

(22) PCT Filed: Dec. 1, 2011

(86) PCT No.: PCT/EP2011/071534
§ 371 (c)(1),
(2), (4) Date: Aug. 8, 2013

(87) PCT Pub. No.: WO2012/084451
PCT Pub. Date: Jun. 28, 2012

(65) Prior Publication Data
US 2013/0320369 A1     Dec. 5, 2013

(30) Foreign Application Priority Data
Dec. 20, 2010  (DE) .......... 10 2010 055 265

(51) Int. Cl.
*H01L 29/20* (2006.01)
*H01L 33/08* (2010.01)
(Continued)

(52) U.S. Cl.
CPC ............ *H01L 33/08* (2013.01); *H01L 25/0753* (2013.01); *H01L 27/3211* (2013.01); *H01L 33/50* (2013.01); *H01L 33/60* (2013.01); *H01L 2924/0002* (2013.01)

(58) Field of Classification Search
CPC ......... H01L 33/00; H01L 33/48; H01L 33/50; H01L 33/52; H01L 25/0753; H01L 27/3211; H01L 27/3206; H01L 27/3213; H01L 27/3218; H05B 33/0845; H05B 33/0857
USPC .......................................................... 257/89
See application file for complete search history.

(56) References Cited

U.S. PATENT DOCUMENTS 7,250,715 B2 *  7/2007  Mueller et al. ................. 313/485
2004/0021629 A1 *  2/2004  Sasuga et al. .................. 345/102
(Continued)

FOREIGN PATENT DOCUMENTS

DE      196 38 667 C2    5/2001
DE      102 61 365 A1    7/2004
(Continued)

OTHER PUBLICATIONS

Nguyen et al. Effect of Phosphor Particle Size on Luminous Efficacy of Phosphor-Converted White LED. Journal of Lightware Technology, vol. 27, No. 22, (Nov. 2009).*
(Continued)

*Primary Examiner* — Matthew Landau
*Assistant Examiner* — Eric Ashbahian
(74) *Attorney, Agent, or Firm* — DLA Piper LLP (US)

(57) ABSTRACT

An optoelectronic semiconductor device includes a first light source that emits green, white or white-green light and includes a semiconductor chip that emits in the blue spectral range, and a first conversion element attached directly to the semiconductor chip, a second light source that emits red light, having a semiconductor chip, that emits in a blue spectral range, and having a second conversion element attached directly to the semiconductor chip, and/or having a semiconductor chip that emits in a red spectral range, a third light source that emits blue light and has a semiconductor chip emitting in the blue spectral range, and a filler body having a matrix material into which a conversion agent is embedded, wherein the filler body is disposed downstream of the light sources collectively.

13 Claims, 3 Drawing Sheets

(51) Int. Cl.
*H01L 27/32* (2006.01)
*H01L 25/075* (2006.01)
*H01L 33/50* (2010.01)
*H01L 33/60* (2010.01)

(56) References Cited

U.S. PATENT DOCUMENTS

| | | | |
|---|---|---|---|
| 2005/0127378 A1* | 6/2005 | Suehiro et al. | 257/81 |
| 2005/0207165 A1* | 9/2005 | Shimizu et al. | 362/362 |
| 2006/0033423 A1* | 2/2006 | Nishimura | 313/501 |
| 2006/0261742 A1* | 11/2006 | Ng et al. | 315/86 |
| 2007/0018189 A1* | 1/2007 | Chin et al. | 257/99 |
| 2007/0223219 A1* | 9/2007 | Medendorp et al. | 362/231 |
| 2008/0203415 A1* | 8/2008 | Thompson et al. | 257/98 |
| 2008/0265269 A1* | 10/2008 | Yoo et al. | 257/98 |
| 2008/0297054 A1* | 12/2008 | Speier | 315/152 |
| 2009/0085479 A1* | 4/2009 | Ushikubo | 313/506 |
| 2009/0140271 A1* | 6/2009 | Sah | 257/88 |
| 2009/0224277 A1* | 9/2009 | Leung et al. | 257/98 |
| 2010/0301355 A1* | 12/2010 | Wegleiter et al. | 257/88 |
| 2011/0235306 A1* | 9/2011 | Li et al. | H01L 25/0753 362/84 |

FOREIGN PATENT DOCUMENTS

| | | |
|---|---|---|
| DE | 10 2007 043 355 A1 | 3/2009 |
| DE | 10 2006 023 986 B4 | 4/2009 |
| DE | 10 2008 022 542 A1 | 11/2009 |
| DE | 10 2008 025 756 A1 | 12/2009 |
| DE | 10 2008 025 864 A1 | 12/2009 |
| EP | 1 538 682 A2 | 6/2005 |
| EP | 1 657 757 A2 | 5/2006 |
| WO | 02/054502 A1 | 7/2002 |
| WO | 2009/143795 | 12/2009 |
| WO | WO2010102910 * | 9/2010 ............. H01L 33/60 |

OTHER PUBLICATIONS

Yang et al. The influence of different conditions on the luminescent properties of YAG:Ce phosphor formed by combustion. Journal of Luminescence 122-123 pp. 707-709 (2007).*

Tran, N. et al., "Effect of Phosphor Particle Size on Luminous Efficacy of Phosphor-Converted White LED," *Journal of Lightwave Technology*, vol. 27, No. 22, pp. 5145-5150, Nov. 15, 2009.

English translation of a Chinese Office Action dated May 20, 2015 of corresponding Chinese Application No, 201180061565.5.

* cited by examiner

FIG 2

OPTOELECTRONIC SEMICONDUCTOR DEVICE

TECHNICAL FIELD

This disclosure relates to an optoelectronic semiconductor device.

BACKGROUND

There is a need to provide an optoelectronic device which exhibits a uniform color radiation in dependence upon an emission angle.

SUMMARY

We provide an optoelectronic semiconductor device including a first light source that emits green, white or white-green light and includes a semiconductor chip that emits in the blue spectral range, and a first conversion element attached directly to the semiconductor chip, a second light source that emits red light, having a semiconductor chip, that emits in a blue spectral range, and having a second conversion element attached directly to the semiconductor chip, and/or having a semiconductor chip that emits in a red spectral range, a third light source that emits blue light and has a semiconductor chip emitting in the blue spectral range, and a filler body having a matrix material into which a conversion agent is embedded, wherein the filler body is disposed downstream of the light sources collectively.

We also provide an optoelectronic semiconductor device including a first light source that emits green, white or white-green light and includes a semiconductor chip that emits in a blue spectral range, and a first conversion element attached directly to the semiconductor chip, a second light source that emits red light, having a semiconductor chip that emits in the blue spectral range, and having a second conversion element attached directly to the semiconductor chip, and/or having a semiconductor chip that emits in a red spectral range, a third light source that emits blue light and has a semiconductor chip emitting in the blue spectral range, and a filler body having a matrix material into which a conversion agent is embedded, wherein 1) the filler body is disposed downstream of the light sources collectively, 2) all of the semiconductor chips of the light sources are surrounded in the lateral direction by a reflector filler at least in places, 3) the filler body is disposed downstream of the reflector filler along a main radiation direction of the semiconductor device and is applied directly onto the reflector filler, and 4) the filler body covers the entire reflector filler.

DETAILED DESCRIPTION

The semiconductor device may comprise a first light source. The first light source may be arranged to emit green light, white light or white-green light. The first light source may comprise one or more optoelectronic semiconductor chips arranged to emit light in the blue spectral range during operation of the semiconductor device. The at least one semiconductor chip is preferably a light-emitting diode, LED for short, or a laser diode. The blue spectral range means in particular that a maximum intensity is emitted in the spectral range of 435 nm to 470 nm. A spectral width of the emitted light, based on a full width at half maximum, also referred to as FWHM, is preferably less than 20 nm and is in particular 10 nm to 20 nm.

The first light source may include a first conversion element. The conversion element is preferably attached directly to the semiconductor chip. The term "directly" does not preclude that a connector such as an adhesive is located between the first conversion element and the semiconductor chip, the first conversion element being attached to the semiconductor chip using the connector. Along a main radiation direction of the semiconductor chip, in particular along a direction perpendicular to a radiation main side of the semiconductor chip, a maximum distance of a main side of the first conversion element, facing away from the semiconductor chip, to the semiconductor chip is preferably at the most 200 µm, in particular at the most 160 µm, at the most 120 µm, at the most 80 µm or at the most 40 µm. Preferably, the first conversion element is disposed exclusively downstream of the semiconductor chips of the first light source.

The first conversion element completely or partially covers the radiation main side of the semiconductor chip. The conversion element preferably comprises a transparent matrix material to which a conversion agent is added. The conversion agent and thus the first conversion element are arranged to at least partially absorb light from the semiconductor chip and convert it into light of another wavelength. The first conversion element can be applied directly onto the semiconductor chip by a dispenser process or can also be adhered onto the semiconductor chip in the form of a platelet with a silicone or a ceramic as the matrix material.

The semiconductor device may include a second light source arranged to emit red light during operation of the semiconductor device. Red light means in particular that a wavelength, at which a maximum intensity is emitted, is in the spectral range of 600 nm to 660 nm. For this purpose, the second light source comprises at least one semiconductor chip which emits in the blue spectral range and a second conversion element is disposed preferably immediately downstream of the semiconductor chip, wherein the second conversion element partially or completely absorbs blue light from the semiconductor chip and converts it into red light. The second conversion element is preferably disposed exclusively downstream of the semiconductor chips of the second light source. Alternatively or in addition thereto, the second light source comprises a semiconductor chip which directly emits light in the red spectral range, wherein in that case there is preferably no second conversion element disposed downstream of this second semiconductor chip. The second conversion element can be designed in an analogous manner to the first conversion element.

The semiconductor device, may comprise a third light source. The third light source is arranged to emit blue light during operation of the semiconductor device. For this purpose, the third light source comprises at least one semiconductor chip which emits in the blue spectral range. In particular, the third light source is free of a conversion element.

The semiconductor device may contain a filler body. The filler body comprises a matrix material, for example a silicone, an epoxide, a silicone-epoxide hybrid material or a carbon-based synthetic polymer such as polycarbonate. The matrix material of the filler body is preferably at least partially transparent to light emitted by the light sources. A conversion agent is embedded in the matrix material and arranged to partially absorb light emitted by the light sources and convert it into radiation of a different wavelength.

The filler body may be disposed downstream of the light sources collectively. In other words, the filler body completely or partially covers each of the light sources. Therefore, a sub-region of the filler body follows each of the light sources in places or over the entire surface, along the main radiation directions of the respective semiconductor chips or along a main radiation direction of the semiconductor device.

The optoelectronic semiconductor device may include a first light source which emits green, white or white-green light. The first light source may comprise a semiconductor chip which emits in the blue spectral range and to which a first conversion element is directly attached. The semiconductor device may further contain a second light source which emits in the red spectral range. The second light source may include a semiconductor chip which emits in the blue spectral range and downstream of which a second conversion element is immediately disposed, or the second light source may include a semiconductor chip which emits directly in the red spectral range. The semiconductor device may further comprise a third light source which emits blue light and has a semiconductor chip which emits in the blue spectral range. A filler body of the semiconductor device may include a matrix material into which a conversion agent is embedded. The filler body may be disposed downstream of the light sources collectively.

The filler body ensures that light is distributed along main extension directions of the filler body and/or perpendicular to the main radiation direction of the semiconductor device. Furthermore, the filler body ensures a wavelength conversion of the light generated by the light sources. A more uniform radiation of light, as seen over an emission angle, with respect to a chromaticity co-ordinate (also referred to as color locus) of the light, can hereby be achieved.

At least 75%, preferably at least 90% of the light emitted by the semiconductor chips of the first light source and of the second light source may pass into the first conversion element and into the second conversion element. In other words, substantially all of the radiation emitted by the semiconductor chips of the first light source and of the second light source passes into the associated conversion elements.

All of the semiconductor chips may be disposed on a common carrier. The carrier is in particular a printed circuit board. For example, all of the semiconductor chips are mounted on a common carrier main side of the carrier and oriented in an identical manner in terms of their main radiation directions. All of the main radiation directions of the semiconductor chips can thus be aligned in parallel with each other. In particular, all of the semiconductor chips are in a common plane.

The first conversion element may be arranged to absorb at the most 80% or at the most 70% or at the most 60% or at the most 40% of the radiation emitted by the semiconductor chip of the first light source, which passes into the first conversion element, and to convert it into a different wavelength. Preferably, a portion of the light from the first semiconductor chip, which is converted by the first conversion element into a different wavelength, is 20% to 80% or 40% to 75%. The light emitted by the first light source preferably has a chromaticity co-ordinate in the CIE chromaticity diagram of $0.15 \leq c_x \leq 0.32$ or $0.22 \leq c_x \leq 0.28$.

The filler body may be arranged to convert in each case at least 5% of the light from the semiconductor chips, which emit in the blue spectral range, of the first and of the third light sources into a different wavelength. In particular, the degree of conversion is 15% to 85% or 30% to 80%. Preferably, the filler body does not absorb green and/or red light or only absorbs it to a negligible extent.

Light from the first light source may have, prior to entering the filler body, a chromaticity co-ordinate in the CIE chromaticity diagram of $0.1 \leq c_x \leq 0.31$ and/or $0.1 \leq c_y \leq 0.32$. Furthermore, during operation the semiconductor device may then preferably emit white mixed light formed from light from the three light sources and has a correlated color temperature of 2300 K to 7000 K. The term "white" means in particular that the mixed light emitted by the semiconductor device has a chromaticity co-ordinate, wherein $c_x$ and $c_y$ are each at a distance of at the most 0.02 units from the black-body curve in the CIE chromaticity diagram. The combination of the three light sources can produce a high color reproduction index tR of in particular at least 75 or at least 80 or at least 90.

The filler body may also comprise, in addition to the conversion agent, scattering particles. The scattering particles are arranged to change the direction of light impinging upon the scattering particles. Preferably, a refractive index difference between the matrix material of the filler body and a material of the scattering particles at a temperature of 300 K is at the most 0.10, particularly preferably at the most 0.05 or at the most 0.02. In other words, the refractive index difference between the material of the scattering particles and the conversion agent is comparatively small. The material of the scattering particles is preferably transparent for the light from the light sources. If further scattering particles are present in the filler body which have a larger refractive index difference than that stated, then a portion of these further scattering particles at the filler body is preferably at the most 0.1 vol. % or at the most 0.1 wt. %.

The filler body comprises an average thickness, in particular in a direction in parallel with the main radiation direction of the semiconductor device, of 200 µm to 800 µm or 300 µm to 600 µm. The thickness is in particular averaged over the entire lateral extension of the filler body.

The conversion agent and/or the scattering particles is/are each distributed homogeneously in the entire filler body. In other words, no targeted concentration gradient which extends beyond statistical fluctuations is set in the filler body.

The filler body and the first conversion element of the first light source may contain the same conversion agent, in particular in different volume concentrations. In particular, the conversion agent in the first conversion element has a higher concentration than in the filler body. The same conversion agent means that a material composition of the conversion agent is identical for the filler body and for the first conversion element, within manufacturing tolerances. Preferably, a configuration of particles of the conversion agent is also identical in each case, within manufacturing tolerances, in particular a size distribution of the particles. If the filler body and the first conversion element contain mixtures of conversion agents, then these mixtures can be identical in the filler body and in the first conversion element.

The filler body, the first conversion element and the second conversion element may each have mutually different conversion agents. In particular, the filler body may be free of conversion agents present in the conversion elements. It is possible for the filler body and the conversion elements to contain mixtures of different conversion agents.

A reflector filler may be mounted in each case at least in places on some or all of the semiconductor chips of the light sources in a lateral direction perpendicular to the main radiation direction. The semiconductor chips may thus be completely or partially surrounded by the reflector filler in the lateral direction. Preferably, the reflector filler is in direct, physical contact with the semiconductor chips, in particular each individual semiconductor chip, in the lateral direction.

The filler body may be disposed downstream of the reflector filler and applied at least in places directly onto the reflector filler and/or onto the semiconductor chip of the third light source and/or onto the first conversion element and/or onto the second conversion element. In particular, the filler body may cover the entire reflector filler. The filler body may thus be in direct, physical contact with the components.

The reflector filler may terminate, as seen in a direction along the main radiation direction, flush with the radiation main sides at least of one of the semiconductor chips or of all of the semiconductor chips. There is a tolerance for the flush termination of preferably at the most 40 μm or at the most 20 μm. Alternatively, it is possible for the reflector filler, as seen along the main radiation direction, not to extend as far as the radiation main sides of the semiconductor chips or for the reflector filler to protrude beyond the semiconductor chips along the main radiation direction. The radiation main sides of the semiconductor chips are preferably not covered by the reflector filler.

The semiconductor chips may be spaced apart from each other. In other words, the semiconductor chips do not contact each other. In particular, a material of the reflector filler and/or of the filler body may be located in each case between adjacent semiconductor chips.

The light sources and/or the semiconductor chips can be electrically controlled in a mutually independent manner. The correlated color temperature of the white mixed light emitted by the semiconductor device during operation can be adjusted thereby.

All of the semiconductor chips of the light sources, i.e., all of the semiconductor chips of the semiconductor device, may be identical in terms of structure. For example, they can all be InGaN-based light-emitting diodes which emit blue light.

The third light source may be free of the first and second conversion elements and is not covered thereby. In other words, the filler body may then be the only component which has a conversion agent and is disposed downstream of the third light source in a radiation direction.

A semiconductor device described herein will be explained in more detail hereinafter with reference to the drawings and with the aid of examples. Like reference numerals indicate like elements in the individual figures. However, the references are not shown to scale. Rather, individual elements may be illustrated excessively large for ease of understanding.

Figure 1:
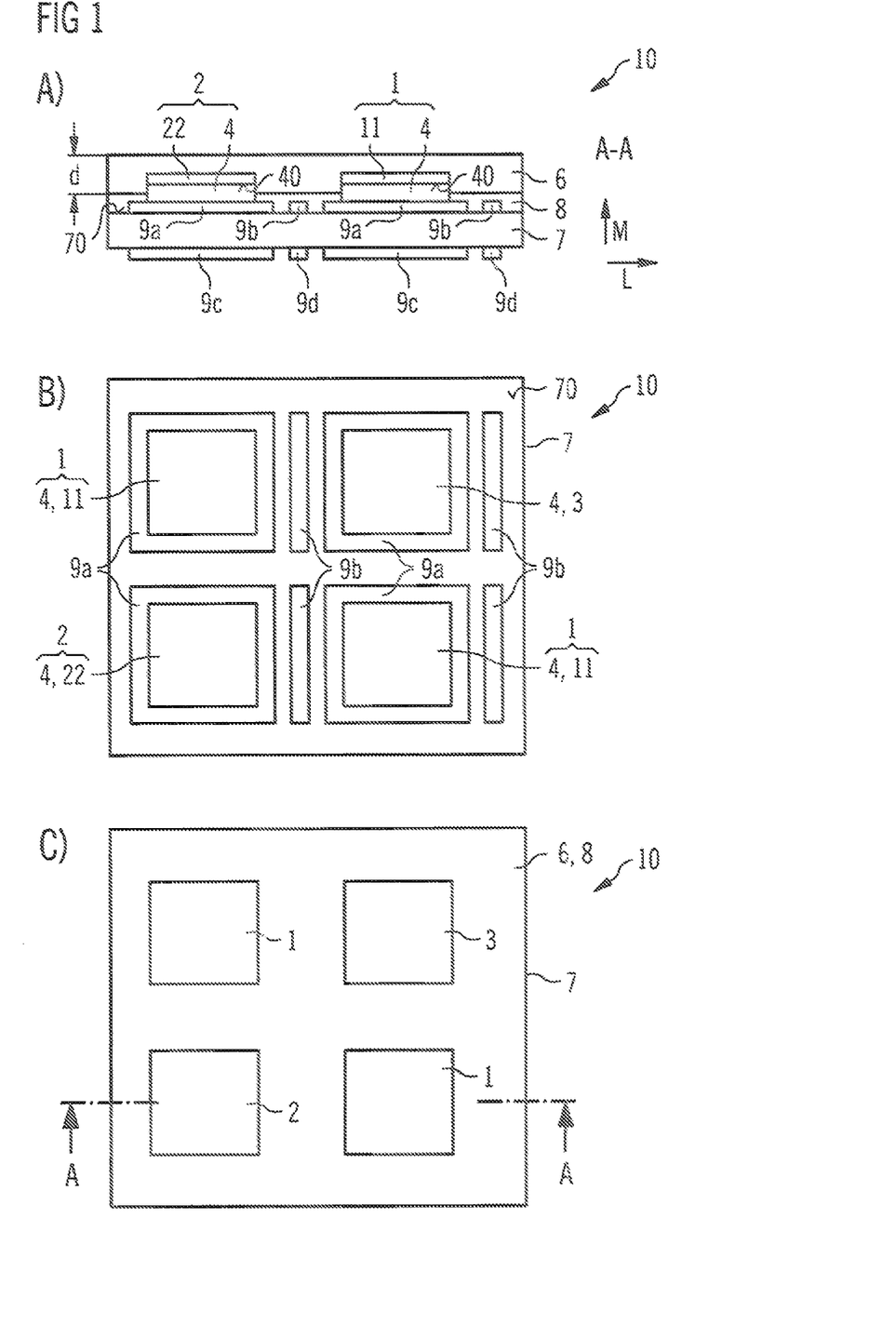
FIGS. 1 to 4 show schematic illustrations of examples of our optoelectronic semiconductor devices.

FIG. 1 illustrates an example of an optoelectronic semiconductor device 10—in FIG. 1A in a schematic sectional view along line A-A, in FIG. 1C in a schematic plan view and in FIG. 1B in a schematic plan view with particular components left out.

The semiconductor device 10 comprises a carrier 7 having a carrier main side 70. Electrical connection points 9a, 9b, 9c, 9d are located on the carrier main side 70 and on a carrier underside opposite thereto. The connection points 9a, 9c are formed to be flat. The connection points 9a, 9b, 9c, 9d are formed from a metal or a metal alloy and preferably have a thickness of 5 μm to 150 μm, in particular 50 μm to 90 μm or 5 μm to 25 μm. The connection points 9a, 9b on the carrier main side 70 preferably electrically and/or thermally connect in each case to the connection points 9c, 9d on the underside of the carrier 7 by interlayer connections, not shown. The carrier 7 is, for example, a ceramic carrier having a high thermal conductivity.

The semiconductor device 10 includes a first light source 1 that emits green-white light, a second light source 2 that emits red light and a third light source 3 that emits blue light. Semiconductor chips 4 of the light sources 1, 2, 3 are attached in each case on the connection points 9a to the carrier main side 70 in a common plane. All of the semiconductor chips 4 are identical in terms of structure and emit in the blue spectral range during operation. The first light source 1 includes two of the semiconductor chips 4, the second light source 2 and the third light source 3 each comprise only one of the semiconductor chips 4. The number of semiconductor chips 4 in the examples of the semiconductor devices 10 can deviate from the illustrated number in each case. A thickness of the semiconductor chips along a main radiation direction M is in particular 80 μm to 200 μm.

A first conversion element 11 is disposed downstream of the semiconductor chips 4 of the first light source 1. The first conversion element 11 is, for example, a silicone platelet which contains a conversion agent. A thickness of the first conversion element 11 along the main radiation direction M of the semiconductor device 10, perpendicular to the carrier main side 70, is in particular 30 μm to 150 μm. The platelet is, for example, adhered to the semiconductor chip 4 and arranged to partially absorb the blue radiation emitted by the semiconductor chip 4 of the first light source 1 and convert it into light of a different wavelength. An emission spectrum of the first conversion element 11 preferably has a maximum intensity in the wavelength range of 525 nm to 570 nm, in particular 550 nm to 560 nm. The emission spectrum of the first conversion element 11 extends, for example, from 530 nm to 580 nm or from 510 nm to 610 nm. For example, the conversion agent is or includes particles consisting of or having a rare earth-doped garnet such as YAG:Ce.

A second conversion element 22 is applied directly onto the semiconductor chip 4 of the second light source 2. A wavelength of maximum emission of the second conversion element 22 is preferably 590 nm to 660 nm, in particular 595 nm to 610 nm. A spectral width of the emission of the second conversion element 22 is preferably 50 nm to 130 nm, based on a full width at half maximum, FWHM. For example, the second conversion element 22 includes a rare earth-doped orthosilicate such as $(Ba, Sr)_2SiO_4$:Eu or a rare earth-doped silicon oxynitride or silicon nitride such as $(Ba, Sr)_2Si_5N_8$:Eu.

In a lateral direction L, the conversion elements 11, 22 terminate in each case flush with the semiconductor chips 4, within manufacturing tolerances. The third light source 3 is free of a conversion element in this case.

In a lateral direction, the semiconductor chips 4 are surrounded on all sides by a reflector filler 8. The reflector filler 8 extends from the carrier main side 70 to just before radiation main sides 40 of the semiconductor chips 4 facing away from the carrier 7. The reflector filler 8 is formed, for example, by a matrix material consisting of a silicone or an epoxide-silicone hybrid material, into which reflective particles are embedded. The reflective particles are preferably titanium dioxide particles or aluminium oxide particles or glass particles. The diameters of the particles are preferably 0.3 μm to 8 μm and a weight proportion of the particles is preferably 5% to 60%. When exposed, the reflector filler 8 preferably appears to a viewer to be white when the semiconductor device is switched off.

Contrary to the illustration in FIG. 1, it is also possible for the reflector filler 8 not to cover the entire carrier main side 70, but rather to cover only regions in proximity to the semiconductor chips 4, for example, the electrical connection points 9a. Bond wires used to electrically contact the semiconductor chips 4, which in particular extend from the radiation main side 40 to the connection points 9b, are not shown in the Figs.

A filler body 6 is disposed downstream of all of the semiconductor chips 4 collectively. The average thickness d of the filler body 6 is 100 μm to 800 μm. Particles of a conversion agent are embedded into a matrix material of the filler body 6. The conversion agent can be the same conversion agent as in the first conversion elements 11 or a different conversion agent. The particles of the conversion agent in the filler body 6 and/or in the conversion elements 11, 22 preferably have an average diameter of 1 μm to 15 μm, in particular 3 μm to 10 μm. A weight proportion of the particles at the filler body 6 is in particular 5% to 25%.

By virtue of the fact that the second conversion element 22 is located in proximity to the carrier 7 and there is no conversion of blue light to red light in the filler body 6, efficient cooling of the second conversion element 22 can be achieved. If the conversion agent of the filler body 6 is a conversion agent different from the conversion agent of the first conversion element 11, then the conversion agent has a maximum emission preferably at wavelengths smaller than the first conversion element 11 by 5 nm to 15 nm. In other words, the filler body 6 then emits radiation of a shorter wavelength and further in the blue range than the first conversion element 11.

Particularly preferably, scattering particles which have, for example, average diameters of 1 μm to 15 μm or 3 μm to 10 μm, are added to the filler body 6. The scattering particles are formed in particular from a silicon dioxide such as cristobalite and/or from a glass. A refractive index difference between the scattering particles and the matrix material of the filler body 6 is preferably at the most 0.05 at room temperature. The filler body 6 comprises a planar top side facing away from the carrier 7. Furthermore, the filler body 6 is applied directly onto the reflector filler 8 and onto the conversion elements 11, 22 and the semiconductor chip 4 of the third light source 3.

In particular, the electrical connections 9a, 9b are covered by the reflector filler 8 and not visible from outside the semiconductor device 10. Furthermore, the radiation, generated in the semiconductor chips 4, from the first light source 1 and the second light source 2 is guided virtually completely into the conversion elements 11, 22. The outer visual appearance when the semiconductor device 10 is switched off can thus be homogenized and efficiency during operation can thus be increased by way of the reflector filler 8. By way of the filler body 6, light is distributed more evenly along the lateral direction L during operation of the semiconductor device 10 and the mixed light is emitted more evenly and in dependence upon the angle.

FIG. 1C shows that the connection points 9a, 9b are covered by the reflector filler 8 while in FIG. 1B neither the reflector filler 8 nor the filler body 6 are shown. Owing to the filler body 6 having the scattering particles, contours of the light sources 1, 2, 3 can appear blurred in plan view, of FIG. 1C. When the semiconductor device 10 is switched off, the filler body 6 can appear to be whitish-green or greenish or yellowish in plan view.

The particles of the conversion agent in the filler body 6 preferably act in an absorbing manner for blue light and preferably merely in a scattering manner for red and green light. The matrix materials of the filler body 6, of the reflector filler 8 and of the conversion elements 11, 22 can be the same material in each case to achieve effective bonding of the components to each other.

The light sources 1, 2, 3 can be electrically controlled in a mutually independent manner and the light thereof mixes during operation of the semiconductor device 10 to form mixed light which is preferably white light and can be adjusted with respect to the color temperature.

The semiconductor chips 4 of the light sources 1, 2, 3 are spaced apart from each other to a comparatively large extent to avoid overheating of the semiconductor device 10. A smallest rectangle, in which the semiconductor chips 4 of all of the light sources 1, 2, 3 can be inscribed as seen in plan view, has dimensions of at least 1.5 mm×1.5 mm, in particular of at least 2.1 mm×2.1 mm or of at least 4.3 mm×4.3 mm.

Figure 2:
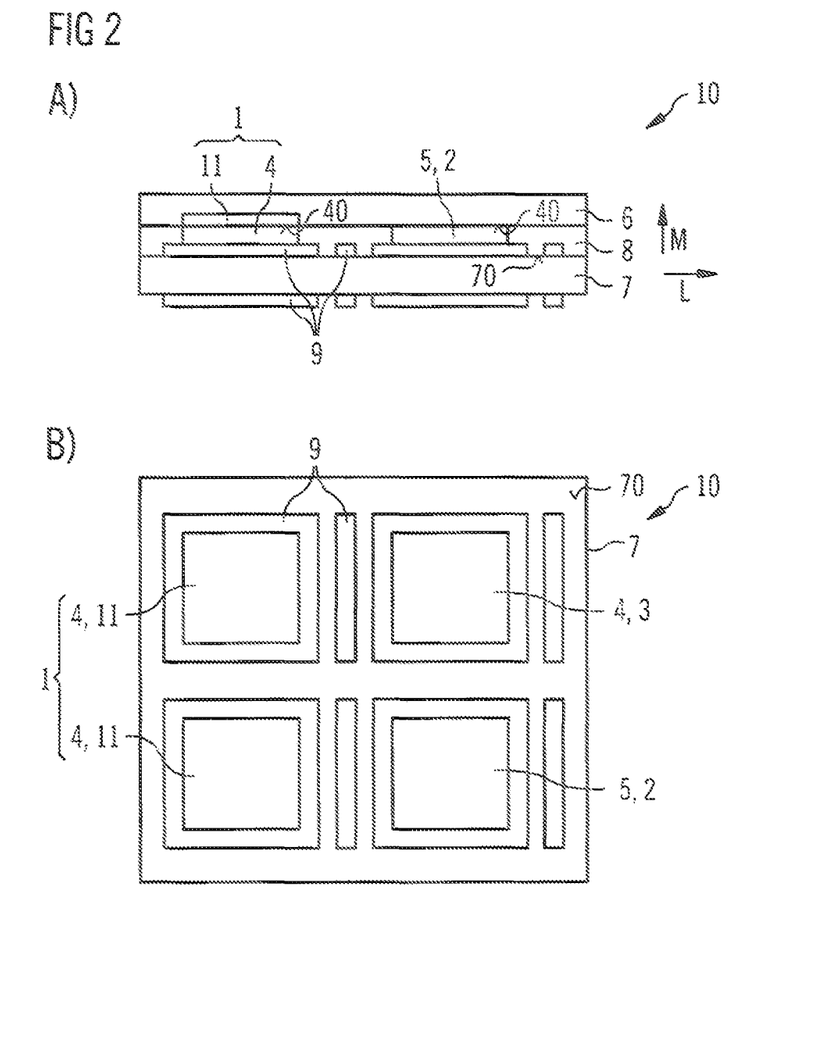

FIG. 2 illustrates a further example of the semiconductor device 10. FIG. 2A shows a sectional view and FIG. 2I shows a plan view without the reflector filler 8 and without the filler body 6.

Contrary to the example shown in FIG. 1, the second light source 2 in accordance with FIG. 2 is formed by a semiconductor chip 5 which emits directly in the red spectral range, for example, an InGaAlP-based light-emitting diode. The second light source 2 is thus free of a conversion element. The light sources 1, 2, 3 are, as seen in plan view, disposed differently from the arrangement of FIG. 1. The reflector body 8 terminates, in a direction in parallel with the main radiation direction M, flush with the radiation main sides 40 of the semiconductor chips 4, 5.

Figure 3:
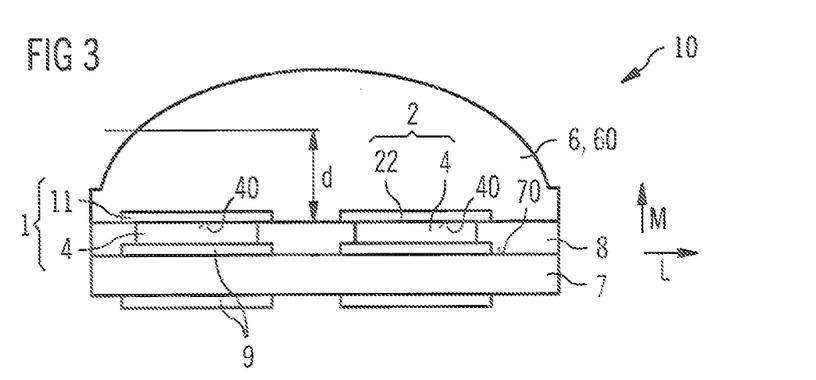

In the example of the semiconductor device 10 in accordance with FIG. 3, shown in a schematic sectional view, the filler body 6 is simultaneously designed as an optical element 60 in the form of a collecting lens. By adding the conversion agent and preferably the scattering particles into the filler body 6, a particularly homogeneous radiation characteristic, dependent upon the angle, can then be achieved since in particular the path length of blue light in the filler body 6 is virtually independent of an emission angle of the light sources 1, 2, 3. The average thickness d of the filler body 6 is preferably 200 μm to 1800 μm.

The conversion elements 11, 22 protrude beyond the semiconductor chips 4 in the lateral direction L and partially cover the reflector filler 8. The filler body 6 is not in direct contact with the semiconductor chips 4. Alternatively, and in contrast to the arrangement shown, it is likewise possible for the conversion elements 11, 22 not to completely cover the radiation main sides 40 and for the radiation main sides 40 of the semiconductor chips 4 of the first and/or second light sources 1, 2 to be in direct contact with the reflector filler 8 in places and to be covered thereby.

Figure 4:
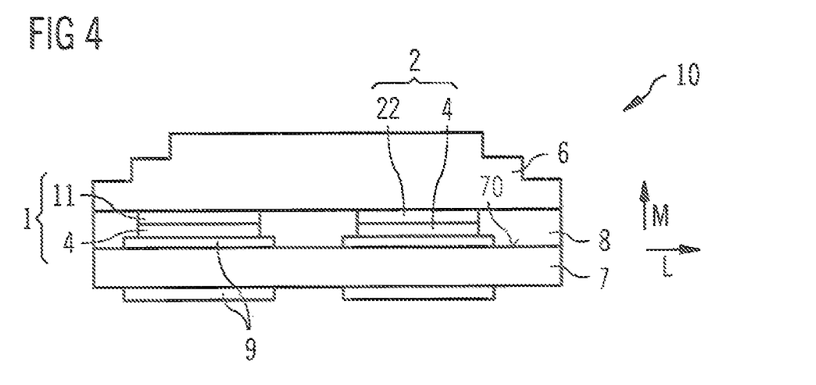

In the sectional view of the semiconductor device 10 of FIG. 4, it can be seen that the reflector filler 8 terminates, along the main radiation direction M, flush with the sides of the conversion elements 11, 22 facing away from the carrier 7. To prevent the semiconductor chips 4 of the third light source 3, not illustrated in FIG. 4, from being covered by the reflector filler 8, a silicone platelet having the same thickness as the conversion elements 11, 22 can be disposed downstream of the semiconductor chips 4, wherein this silicone platelet is then free of a conversion agent. A side of the filler body 6 facing the carrier 7 is formed to be flat. The side of the filler body 6 facing away from the carrier 7 is formed in a step-like manner in cross-section.

The devices described here are not limited by the description using the examples. Rather, this disclosure includes any new feature and any combination of features included in particular in any combination of features in the appended claims, even if the feature or combination itself is not explicitly stated in the claims or examples.

The invention claimed is:

1. An optoelectronic semiconductor device comprising:
   a first light source that emits white-green light and comprises a semiconductor chip that emits in a blue spectral range, and a first conversion element attached directly to the semiconductor chip,
   a second light source that emits red light, having a semiconductor chip that emits in the blue spectral range, and having a second conversion element attached directly to the semiconductor chip, and/or having a semiconductor chip that emits in a red spectral range, a third light source that emits blue light and has a semiconductor chip emitting in the blue spectral range, the third light source is free of a conversion element, and a filler body having a matrix material which is a silicone and into which a conversion agent is embedded and distributed homogenously in the entire filler body, wherein 1) the filler body is disposed downstream of the light sources collectively,
2) all of the semiconductor chips of the light sources are surrounded in the lateral direction by a reflector filler at least in places, the reflector filler is formed from a silicone as a matrix material into which reflective particles are embedded,
3) the filler body is disposed downstream of the reflector filler along a main radiation direction of the semiconductor device and is applied directly onto the reflector filler,
4) the filler body covers the entire reflector filler,
5) the first conversion element converts at most 70% of the light from the semiconductor chip of the first light source,
6) the filler body converts between 30% and 80% of the light from the semiconductor chips which emit in the blue spectral range, of the first and of the third light sources and the filler body does not absorb green and red light or only absorbs it to a negligible extent,
7) the optoelectronic semiconductor device emits white mixed light formed from light from the three light sources and from the filler body, and
8) the filler body and the first conversion element comprise the same conversion agent in different concentrations.

2. The optoelectronic semiconductor device according to claim 1, wherein the conversion agent of the filler body is in the form of particles having an average diameter of 1 µm to 15 µm, and the particles act in an absorbing manner for blue light and in a scattering manner for red and green light.

3. The optoelectronic semiconductor device according to claim 1, wherein the filler body also includes, in addition to the conversion agent, scattering particles, wherein a refractive index difference between the matrix material and the scattering particles is at most 0.10 at a temperature of 300 K.

4. The optoelectronic semiconductor device according to claim 3, wherein the filler body has an average thickness of 200 µm to 800 µm, and the particles of the conversion agent and the scattering particles are each distributed homogeneously in the entire filler body.

5. The optoelectronic semiconductor device according to claim 1, wherein all of the semiconductor chips of the light sources are surrounded in the lateral direction by a reflector filler at least in places, and the filler body is disposed downstream of the reflector filler along a main radiation direction of the semiconductor device and applied at least in places directly onto the reflector filler and onto the semiconductor chip of the third light source and onto the first conversion element and onto the second conversion element.

6. The optoelectronic semiconductor device according to claim 5, wherein the reflector filler terminates, in a direction parallel to the main radiation direction and with a tolerance of at the most 15 µm, flush with radiation main sides of the semiconductor chips of the light sources.

7. The optoelectronic semiconductor device according to claim 5, wherein the reflector filler appears to be white and comprises reflector particles, and the reflector filler and the filler body comprise the same matrix material.

8. The optoelectronic semiconductor device according to claim 1, wherein all of the semiconductor chips of the light sources are attached on a common carrier in a common plane, and the semiconductor chips are distributed over a surface of at least 1.5×1.5 mm².

9. The optoelectronic semiconductor device according to claim 1, wherein the light sources can be mutually independently electrically controlled, and the correlated color temperature of the white mixed light emitted by the semiconductor device during operation can be adjusted.

10. The optoelectronic semiconductor device according to claim 1,
wherein the light from the first light source has, prior to entering the filler body, a chromaticity co-ordinate in the CIE chromaticity diagram of $0.1 \leq c_x \leq 0.31$ and $0.1 \leq c_y \leq 0.32$,
wherein the semiconductor device, during operation, emits white mixed light with a correlated color temperature of 2300K to 7000 K.

11. The optoelectronic semiconductor device according to claim 1,
further comprising a carrier with a carrier main side onto which the semiconductor chips are mounted, wherein
1) the reflector filler extends from the carrier main side not until radiation main sides of the semiconductor chips facing away from the carrier,
2) a thickness of the first conversion element is 30 µm to 150 µm, the first conversion element is a platelet,
3) an emission spectrum of the first conversion element has a maximum intensity in the wavelength range of 550 nm to 560 nm,
4) a wavelength of maximum emission of the second conversion element is 595 nm to 610 nm, and
5) a spectral width of the emission of the second conversion element is 50 nm to 130 nm, based on a full width at half maximum.

12. An optoelectronic semiconductor device comprising:
a first light source that emits white-green light and comprises a semiconductor chip that emits in a blue spectral range, and a first conversion element attached directly to the semiconductor chip,
a second light source that emits red light, having a semiconductor chip that emits in the blue spectral range, and having a second conversion element attached directly to the semiconductor chip, and/or having a semiconductor chip that emits in a red spectral range,
a third light source that emits blue light and has a semiconductor chip emitting in the blue spectral range, the third light source is free of a conversion element, and
a filler body having a matrix material which is a silicone and into which a conversion agent is embedded and distributed homogenously in the entire filler body, wherein
1) the filler body is disposed downstream of the light sources collectively,
2) all of the semiconductor chips of the light sources are surrounded in the lateral direction by a reflector filler at least in places, the reflector filler is formed from a silicone as a matrix material into which reflective particles are embedded,
3) the filler body is disposed downstream of the reflector filler along a main radiation direction of the semiconductor device and is applied directly onto the reflector filler,
4) the filler body covers the entire reflector filler, 5) the first conversion element converts at most 70% of the light from the semiconductor chip of the first light source,
6) the filler body converts between 30% and 80% of the light from the semiconductor chips which emit in the blue spectral range, of the first and of the third light sources and the filler body does not absorb green and red light or only absorbs it to a negligible extent,
7) the optoelectronic semiconductor device emits white mixed light formed from light from the three light sources and from the filler body,
8) the light from the first light source has, prior to entering the filler body, a chromaticity coordinate in the CIE chromaticity diagram of $0.1<cx<0.31$ and $0.1<cy<0.32$,
9) the semiconductor device, during operation, emits white mixed light with a correlated color temperature of 2300K to 7000 K,
10) the filler body and the second conversion element contain mutually different conversion agents, and
11) the filler body comprises, in addition to the conversion agent, scattering particles, a refractive index difference between the matrix material of the filler body and a material of the scattering particles at a temperature of 300K is at the most 0.02.

13. The optoelectronic semiconductor device according to claim 1, wherein
the second light source comprises a blue emitting chip followed by the second conversion element,
the reflective filler terminates flush with the first and second conversion elements in a direction away from the corresponding semiconductor chips when viewed in a cross-sectional view,
a wavelength of maximum intensity of the blue light emitted by the semiconductor chips is 435 nm to 470 nm and an FWHM of the blue light is 10 nm to 20 nm, and
the filler body is applied directly to the conversion elements and has a planar top side.

* * * * *